United States Patent

Takeda et al.

[11] Patent Number: 6,156,481
[45] Date of Patent: Dec. 5, 2000

[54] POSITIVE RESIST COMPOSITION

[75] Inventors: Takanobu Takeda; Osamu Watanabe; Jun Watanabe; Jun Hatakeyama; Youichi Ohsawa; Toshinobu Ishihara, all of Nakakubiki-gun, Japan

[73] Assignee: Shin-Etsu Chemical Co., Ltd., Tokyo, Japan

[21] Appl. No.: 09/428,911

[22] Filed: Oct. 28, 1999

[30] Foreign Application Priority Data

Oct. 29, 1998 [JP] Japan .................................. 10-307727

[51] Int. Cl.$^7$ ...................................... G03F 7/004
[52] U.S. Cl. ........................................ 430/270.1; 430/910
[58] Field of Search ................................ 430/270.1, 910

[56] References Cited

U.S. PATENT DOCUMENTS

| | | | |
|---|---|---|---|
| 4,491,628 | 1/1985 | Ito et al. ................. | 430/176 |
| 4,603,101 | 7/1986 | Crivello .................. | 430/270 |
| 5,252,435 | 10/1993 | Tani et al. ............... | 430/325 |
| 5,324,804 | 6/1994 | Steinmann ............... | 526/313 |
| 5,942,367 | 8/1999 | Watanabe et al. ........ | 430/170 |
| 6,033,828 | 3/2000 | Shimada et al. ......... | 430/270.1 |

FOREIGN PATENT DOCUMENTS

| | | |
|---|---|---|
| 249139 | 12/1987 | European Pat. Off. . |
| 62-115440 | 5/1987 | Japan . |
| 63-27829 | 2/1988 | Japan . |
| 2-27660 | 6/1990 | Japan . |
| 3-223858 | 10/1991 | Japan . |
| 4-211258 | 8/1992 | Japan . |
| 6-100488 | 4/1994 | Japan . |
| 8-101509 | 4/1996 | Japan . |
| 8-146610 | 6/1996 | Japan . |

OTHER PUBLICATIONS

English abstract of JP 4211258, Aug. 1992.
English abstract of JP 8101509, Apr. 1996.
English abstract of JP 8146610, Jun. 1996.

*Primary Examiner*—Janet Baxter
*Assistant Examiner*—Rosemary Ashton
*Attorney, Agent, or Firm*—Millen, White, Zelano & Branigan, P.C.

[57] ABSTRACT

A hydroxystyrene-(meth)acrylate copolymer in which some phenolic hydroxyl groups are crosslinked with acid labile groups is blended as a base resin in a positive resist composition, which has the advantages of enhanced dissolution inhibition and an increased dissolution contrast after exposure.

8 Claims, No Drawings

POSITIVE RESIST COMPOSITION

BACKGROUND OF THE INVENTION

1. Field of the Invention

This invention generally relates to a copolymer of hydroxystyrene and a (meth)acrylate wherein some phenolic hydroxyl groups are crosslinked with acid labile groups, and more particularly, to a positive working resist composition, especially of the chemical amplification type, comprising the copolymer as a base resin which has a much improved alkali dissolution contrast before and after exposure, high sensitivity, and high resolution, and is well suited as a micropatterning material for VLSI fabrication.

2. Prior Art

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a minimum feature size of 0.5 μm or less and, when a resist having low light absorption is used, can form patterns with sidewalls that are nearly perpendicular to the substrate.

Recently developed acid-catalyzed chemically amplified positive resists, such as those described in JP-B 2-27660, JP-A 63-27829, U.S. PAT. NO. 4,491,628 and U.S. PAT. NO. 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base resin and a photoacid generator, and three-component systems comprising a base resin, a photoacid generator, and a dissolution inhibitor having acid labile groups.

For example, JP-A 62-115440 describes a resist comprising poly-p-tert-butoxystyrene and a photoacid generator. JP-A 3-223858 describes a similar two-component resist comprising a resin bearing tert-butoxy groups within the molecule, in combination with a photoacid generator. JP-A 4-211258 describes a two-component resist which is comprised of polyhydroxystyrene bearing methyl, isopropyl, tert-butyl, tetrahydropyranyl, or trimethylsilyl groups, together with a photoacid generator. JP-A 6-100488 discloses a resist comprised of a polydihydroxystyrene derivative, such as poly[3,4-bis(2-tetrahydropyranyloxy) styrene], poly[3,4-bis(tert-butoxy-carbonyloxy)styrene] or poly[3,5-bis(2-tetrahydro-pyranyloxy)styrene], and a photoacid generator.

However, when the base resin in these resists bears acid labile groups on side chains and these acid labile groups are groups such as tert-butyl and tert-butoxycarbonyl which are cleaved by strong acids, the resist pattern tends to take on a T-top profile. By contrast, since alkoxyalkyl groups such as ethoxyethyl are cleaved by weak acids, their use has the drawback that the pattern configuration considerably narrows as the time interval between exposure and heat treatment increases. Moreover, the presence of bulky groups on the side chains lowers the heat resistance of the resin and makes it impossible to achieve a satisfactory sensitivity and resolution. These problems have hitherto prevented the practical implementation of either approach, and workable solutions have been sought.

Other known resist compositions use (meth)acrylate copolymers for achieving a higher transparency, improving the adhesion to the substrate and restraining the footing to the substrate as disclosed in JP-A 8-101509 and 8-146610. The resist compositions of this type suffer from low heat resistance and partial pattern collapse.

SUMMARY OF THE INVENTION

An object of the invention is to provide a positive working resist composition, especially of the chemical amplification type, which has a higher sensitivity, resolution, and exposure latitude than conventional positive resist compositions and lends itself to the micropatterning process.

The inventor has found that a polymer comprising recurring units of the following general formula (1) or (2) and having a weight average molecular weight of 1,000 to 500,000 is effective as a base resin in a positive resist composition, especially a chemical amplification type positive resist composition; that a chemical amplification type positive resist composition comprising the polymer, a photoacid generator and an organic solvent is improved in that the dissolution contrast of a resist film is increased, especially the dissolution rate thereof after exposure is increased, and has a high resolution, a high exposure latitude, and improved process flexibility. The composition is thus well suited for practical use and advantageously used in precise microfabrication, especially in VLSI manufacture.

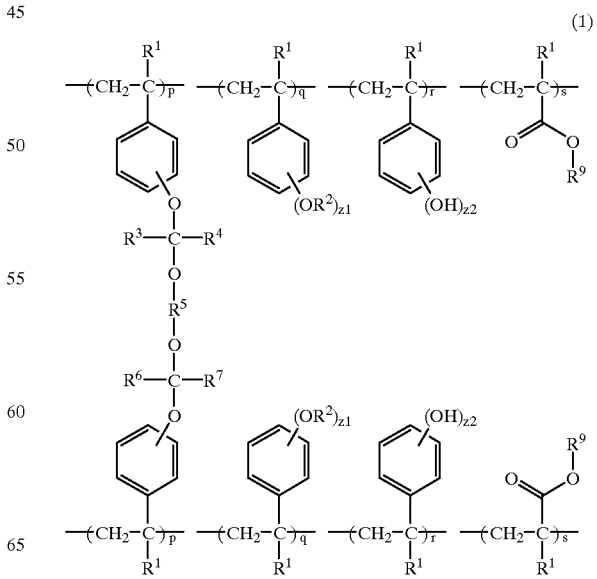

-continued

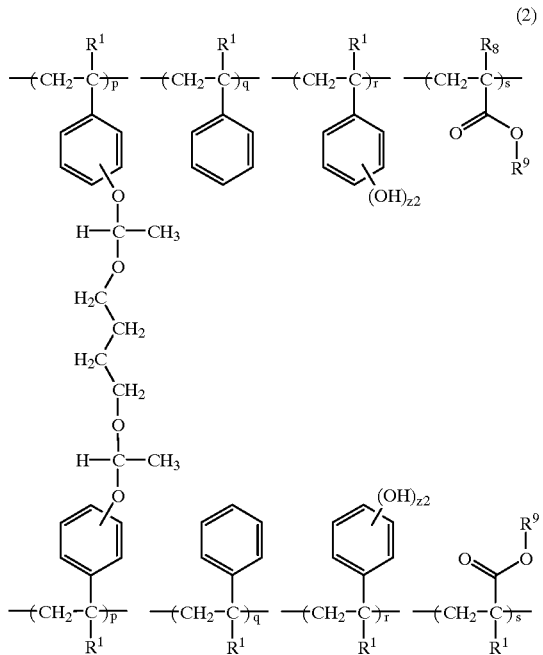

(2)

In the formulae, $R^1$ is hydrogen or methyl, $R^2$ is an acid labile group, $R^3$, $R^4$, $R^6$, and $R^7$ are independently hydrogen or straight or branched alkyl groups of 1 to 6 carbon atoms, $R^5$ is a straight, branched or cyclic alkylene, alkylene ether, cyclohexylene or arylene group of 1 to 10 carbon atoms, $R^8$ is hydrogen, methyl, phenyl or cyano group, $R^9$ is hydrogen or a substituted or unsubstituted, straight, branched or cyclic alkyl group of 1 to 10 carbon atoms wherein the substituent is vinyl, acetyl, phenyl or cyano. The units may be either of one type or two or more different types. The letters p, r and s are positive numbers and q is 0 or a positive number, satisfying $0<p/(p+q+r+s)\leq0.8, 0\leq q/(p+q+r+s)\leq0.8$, and $0<s/(p+q+r+s)\leq0.9$, z1 is an integer of 1 to 3, and z2 is an integer of 0 to 3.

In the polymer of formula (1) or (2), some phenolic hydroxyl groups are crosslinked with acid labile groups. When such a polymer is blended as a base resin in a resist composition, the crosslinking with acid labile groups offers to the composition the advantages of enhanced dissolution inhibition and an increased dissolution contrast after exposure.

More particularly, a polymer having alkoxyalkyl groups added on side chains alone is unlikely to take on a T-top profile because elimination reaction takes place with weak acid, but has the drawback that because of its acid sensitivity, the pattern configuration considerably narrows as the time interval between exposure and heat treatment increases. Also, since the polymer is less effective in inhibiting dissolution in base solutions, a highly substituted polymer must be used to achieve a dissolution contrast, but at the expense of heat resistance.

On the other hand, if a polymer in which phenolic hydroxyl groups on side chains are protected with tert-butoxycarbonyl (t-BOC) groups is included in the resist composition, the alkali dissolution inhibiting effects improve, as a result of which dissolution contrast is achieved at a low substitution ratio and the heat resistance is good. However, deprotection to render the polymer alkali soluble requires a photoacid generator which generates a strong acid such as trifluoromethanesulfonic acid. Unfortunately, the use of such a strong acid tends to result in a T-top profile as mentioned earlier.

Further, if a copolymer whose (meth)acrylic acid is protected with acid labile groups is blended in the resist composition, there result the drawbacks of partial pattern collapse and footing.

By contrast, the chemically amplified positive resist composition having the polymer of formula (1) or (2) formulated as the base resin minimizes the problems including the likelihood of T-top profiling, thinning of the pattern configuration, low heat resistance, partial pattern collapse, and footing. As a consequence, the chemically amplified positive resist composition has a high sensitivity and resolution, is easy to control the size and configuration of a resist pattern, and lends itself to the micropatterning process.

Accordingly, in a first aspect, the invention provides a positive resist composition comprising a polymer comprising recurring units of the general formula (1) and having a weight average molecular weight of 1,000 to 500,000.

In a second aspect, the invention provides a positive resist composition comprising an acrylate copolymer comprising recurring units of the general formula (2) which is acetal crosslinked through a butylene group, and especially protected with acid-eliminatable substituents represented by the general formula (3) or (4) to be described later, and having a weight average molecular weight of 1,000 to 500,000.

In a third aspect, the invention provides a chemical amplification type positive resist composition comprising (A) an organic solvent, (B) the above-defined polymer as a base resin, and (C) a photoacid generator.

In a fourth aspect, the invention provides a chemical amplification type positive resist composition comprising (A) an organic solvent, (B) the above-defined polymer as a base resin, (C) a photoacid generator, and (D) a dissolution inhibitor.

DESCRIPTION OF THE PREFERRED EMBODIMENTS

Polymer

The high molecular weight compound of the invention is a copolymer comprising units of the following general formula (1) or (2).

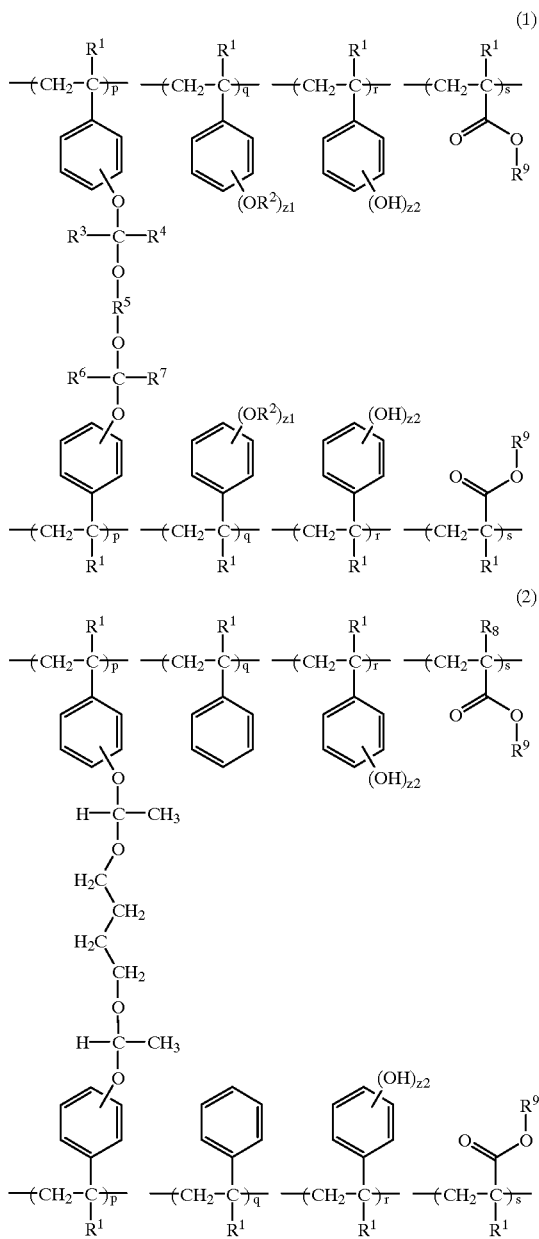

In formula (1) or (2), $R^1$ is hydrogen or methyl, $R^2$ is an acid labile group, $R^3$, $R^4$, $R^6$, and $R^7$ are independently hydrogen or straight or branched alkyl groups of 1 to 6 carbon atoms, $R^5$ is a straight, branched or cyclic alkylene, alkylene ether, cyclohexylene or arylene group of 1 to 10 carbon atoms, $R^8$ is hydrogen, methyl, phenyl or cyano group, $R^9$ is hydrogen or a substituted or unsubstituted, straight, branched or cyclic alkyl group of 1 to 10 carbon atoms wherein the substituent is vinyl, acetyl, phenyl or cyano. The units may be either of one type or two or more different types. The letters p, r and s are positive numbers and q is 0 or a positive number, satisfying $0<p/(P+q+r+s) \leq 0.8, 0 \leq q/(P+q+r+s) \leq 0.8$, and $0<s/(P+q+r+s) \leq 0.9$, zl is an integer of 1 to 3, and z2 is an integer of 0 to 3.

The formulae (1) and (2) are described in more detail. $R^1$ is hydrogen or methyl. $R^2$ is an acid labile group, which is selected from many such groups, preferably tetrahydropyranyl, tetrafuranyl, and trialkylsilyl groups in which the alkyl moieties each have 1 to 4 carbon atoms.

Exemplary alkyl groups represented by $R^3$, $R^4$, $R^6$, and $R^7$ are methyl, ethyl, propyl, n-butyl, isobutyl, tert-butyl, hexyl and cyclohexyl.

Examples of the groups represented by $R^5$ include alkylene groups such as methylene, ethylene, propylene, butylene, hexylene, and octylene, alkylene ether groups which are equal to the foregoing alkylene groups having an intervening oxygen atom, cyclohexylene, phenylene and xylylene. Those groups of 2 to 6 carbon atoms are preferable, and the straight alkylene group having 4 carbon atoms, that is, butylene is most preferable.

The unsubstituted alkyl groups represented by $R^9$ are the same as the above-exemplified alkyl groups. Preferably $R^9$ is a tertiary alkyl group serving as an acid labile group. More preferably, $R^9$ is a cyclic alkyl group of the following general formula (3):

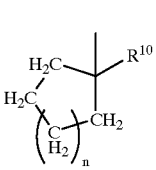

(3)

wherein $R^{10}$ is a methyl, ethyl, isopropyl, vinyl, acetyl, phenyl or cyano group, and n is an integer of 0 to 3.

The cyclic alkyl groups of formula (3) are preferably 5-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

Also preferably, $R^9$ is a substituted alkyl group of the following general formula (4):

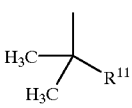

(4)

wherein $R^{11}$ is a vinyl, acetyl, phenyl or cyano group. Exemplary such alkyl groups include 1-vinyldimethyl, 1-acetyldimethyl, 1-phenyldimethyl and 1-cyanodimethyl.

When characteristics of a resist composition having the above-defined polymer formulated as a base resin are taken into account, the letters p, r and s are positive numbers and q is 0 or a positive number, satisfying $0<p/(p+q+r+s) \leq 0.8$, preferably $0.02 \leq p/(p+q+r+s)$, more preferably $p/(p+q+r+s) \leq 0.4$;

$0 \leq q/(p+q+r+s) \leq 0.8$, preferably $0 \leq q/(p+q+r+s) \leq 0.5$;

$0<s/(p+q+r+s) \leq 0.9$, preferably $0<s/(p+q+r+s) \leq 0.5$, more preferably $0<s/(p+q+r+s) \leq 0.3$; and $0<r/(p+q+r+s) \leq 0.8$, preferably $0<r/(p+q+r+s) \leq 0.7$.

Further preferably, the letters satisfy $0<(p+q)/(p+q+r+s) \leq 0.8$, more preferably $0.07 \leq (p+q)/(p+q+r+s) \leq 0.5$.

If any one of p, r and s is equal to 0 so that the polymer of formula (1) does not contain the units associated therewith, the contrast of alkali dissolution rate becomes low and the resolution becomes exacerbated. If the ratio of p to the entirety (=p+q+r+s) is less than 0.02, there is a likelihood of failing to take advantage of acid labile crosslinking groups. If the ratio of p to the entirety exceeds 0.8, or if the ratio of p+q to the entirety exceeds 0.8, the polymer would become gel and lose alkali dissolution due to over-crosslinking, induce film thickness changes and generation of internal stresses or bubbles upon alkali development, and lose adhesion to the substrate due to reduced hydrophilic groups. If the ratio of r to the entirety exceeds 0.8, the contrast of dissolution rate would be exacerbated. If the ratio of s to the entirety is too high, the alkali dissolution rate of unexposed areas becomes too low and the dry etching resistance is lost. By properly selecting p, q, r and s within the above ranges, it becomes possible to control the size and configuration of a resist pattern.

In formula (1) or (2), z1 is an integer of 1 to 3, and z2 is an integer of 0 to 3.

The content of the acid labile groups in the polymer has substantial influence on the dissolution rate contrast of a resist film and governs the properties of a resist composition relating to the size and configuration of a resist pattern.

The polymer of the invention should have a weight average molecular weight of 1,000 to 500,000, preferably 3,000 to 30,000. With a weight average molecular weight of less than 1,000, resists would be less resistant to heat. Too high a weight average molecular weight has a tendency that alkali dissolution lowers and a footing phenomenon arises after pattern formation.

It is understood that prior to crosslinking, a hydroxystyrene-(meth)acrylate copolymer having a wide molecular weight dispersity (Mw/Mn) contains more polymers of low molecular weight and high molecular weight. Such a wide dispersity obstructs the design of the number of crosslinks and it is rather difficult to reproduce resist materials having the same properties. The influence of a molecular weight and its dispersity becomes greater as the pattern rule becomes finer. In order that a resist material be advantageously used in patterning features to a finer size, the hydroxystyrene-(meth)acrylate copolymer should preferably be a monodisperse one having a molecular weight dispersity of 1.0 to 2.0, especially 1.0 to 1.5.

The polymer of the invention is prepared by introducing acid labile crosslinking groups into a hydroxystyrene-(meth) acrylate copolymer through chemical reaction. This crosslinking reaction is effected by adding some of the hydrogen atoms of hydroxyl groups in hydroxystyrene units to vinyl groups in a divinyl ether compound (to be described just below) in the presence of an acid catalyst, for thereby crosslinking and protecting some of hydroxyl groups in polyhydroxystyrene (in a proportion of p mol per mol of the overall hydroxyl groups) with alkoxyalkyl groups, as shown by the following formula (5).

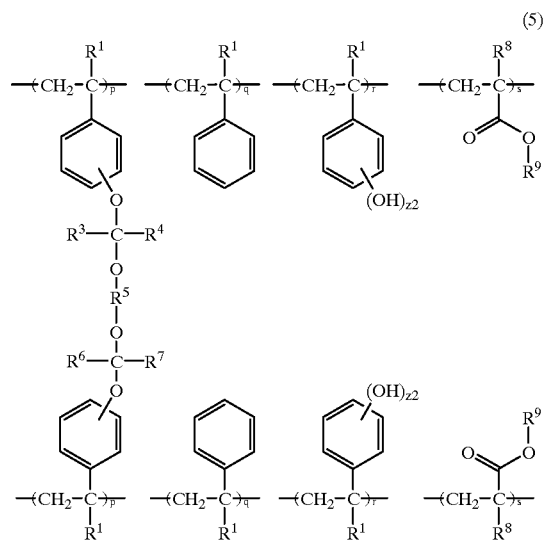

Herein, $R^1$, $R^3$ to $R^9$, p, q, r and s are as defined above.

Exemplary divinyl ether compounds are divinyl ether derivatives including ethylene glycol divinyl ether, diethylene glycol divinyl ether, triethylene glycol divinyl ether, 1,4-butanediol divinyl ether, neopentyl glycol divinyl ether, hexanediol divinyl ether, tetraethylene glycol divinyl ether, 1,4-di(vinyl ether methyl)cyclohexane, 1,4-di(vinyl ether methoxy)benzene, and 1,4-di(vinyl ether ethoxy)benzene. It is preferred that the crosslinking alkyl chain have 2 to 6 carbon atoms, and it is especially preferred to use a divinyl ether compound having 4 carbon atoms, that is, 1,4-butanediol divinyl ether.

The above reaction is preferably carried out in a solvent such as dimethylformamide, tetrahydrofuran or dimethylacetamide. The acids used as the catalyst include hydrochloric acid, sulfuric acid, p-toluenesulfonic acid, methanesulfonic acid, and p-toluenesulfonic acid pyridinium salt. An appropriate amount of the acid used is 0.1 to 10 mol% based on the moles of the overall hydroxyl groups in the polyhydroxystyrene to be reacted. The reaction temperature is from room temperature to about 60° C. and the time is from about 1 to about 20 hours.

An alternative procedure of crosslinking and protecting some of the hydroxyl groups in the polyhydroxystyrene with alkoxyalkyl groups is by reacting an alkali hydride (e.g., NaH) or a base (e.g., triethylamine or pyridine) and a haloethyl ether (e.g., 1,4-butanediol dichloroethyl ether) with polyhydroxystyrene in the presence of a solvent (e.g., dimethyl sulfoxide or tetrahydrofuran). In this procedure, the alkali hydride or base is used in such amounts that a predetermined amount of crosslinking groups is introduced per mol of the entire hydroxyl groups in the polyhydroxystyrene. The reaction temperature is from 0° C. to about 50° C. and the time is from about 1 to about 20 hours.

Resist Composition

The chemical amplification type positive resist composition of the invention contains (A) an organic solvent, (B) the above-defined polymer as a base resin, (C) a photoacid generator, and optionally (D) a dissolution inhibitor and (E) a basic compound.

The organic solvent used as component (A) in the invention may be any organic solvent in which the photoacid generator, base resin, dissolution regulator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, and ethyl 3-ethoxypropionate. These solvents may be used alone or in combinations of two or more thereof. Of the above organic solvents, diethylene glycol dimethyl ether and 1-ethoxy-2-propanol are preferred because the photoacid generator is most soluble therein.

The amount of the organic solvent used is preferably about 200 to 1,000 parts, more preferably about 400 to 800 parts by weight per 100 parts by weight of the base resin (B).

The photoacid generators (C) used in the resist composition of the invention include onium salts of the general formula (6) below, diazomethane derivatives of formula (7), glyoxime derivatives of formula (8), β-ketosulfone derivatives, disulfone derivatives, nitrobenzylsulfonate derivatives, sulfonic acid ester derivatives, and imidoyl sulfonate derivatives.

$$(R^{30})_b M^+ K^- \tag{6}$$

In the formula, $R^{30}$ is a normal, branched or cyclic alkyl group of 1 to 12 carbon atoms, an aryl group of 6 to 12 carbon atoms, or an aralkyl group of 7 to 12 carbon atoms; $M^+$ is iodonium or sulfonium; $K^-$ is a non-nucleophilic counter-ion; and the letter b is equal to 2 or 3.

Illustrative examples of alkyl groups represented by $R^{30}$ include methyl, ethyl, propyl, butyl, cyclohexyl, 2-oxocyclohexyl, norbornyl, and adamantyl. Exemplary aryl groups include phenyl; alkoxyphenyl groups such as p-methoxyphenyl, m-methoxyphenyl, o-methoxyphenyl, ethoxy-phenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl and dimethylphenyl. Exemplary aralkyl groups include benzyl and phenethyl. Examples of the non-nucleophilic counter-ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

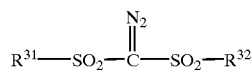

(7)

In the formula, $R^{31}$ and $R^{32}$ are normal, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{31}$ and $R^{32}$ include methyl, ethyl, propyl, butyl, amyl, cyclopentyl, cyclohexyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorobenzene, chlorobenzene, and 1,2,3,4,5-pentafluorobenzene. Exemplary aralkyl groups include benzyl and phenethyl.

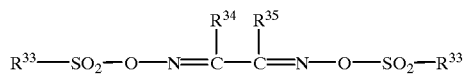

(8)

In the formula, $R^{33}$, $R^{34}$ and $R^{35}$ are normal, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{34}$ and $R^{35}$ may together form a cyclic structure with the proviso that when they form a cyclic structure, each is a normal or branched alkylene group of 1 to 6 carbon atoms.

The alkyl, halogenated alkyl, aryl, halogenated aryl, and aralkyl groups represented by $R^{33}$, $R^{34}$ and $R^{35}$ are exemplified by the same groups mentioned above for $R^{31}$ and $R^{32}$. Examples of alkylene groups represented by $R^{34}$ and $R^{35}$ include methylene, ethylene, propylene, butylene, and hexylene.

Illustrative examples of the photoacid generator include:
onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl) phenylsulfonium trifluoromethane-sulfonate, tris(p-tert-butoxyphenyl)sulfonium trifluoro-methanesulfonate, triphenylsulfonium p-toluenesulfonate, (p-tert-butoxyphenyl) diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenyl-sulfonium butanesulfonate, trimethylsulfonium trifluoro-methanesulfonate, trimethylsulfonium p-toluenesulfonate, cyclohexylmethyl(2-oxocyclohexyl)sulfonium trifluoromethane-sulfonate, cyclohexylmethyl(2-oxocyclohexyl)sulfonium p-toluenesulfonate, dimethylphenylsulfonium trifluoro-methanesulfonate methanesulfonate, dimethylphenylsulfonium p-toluenesulfonate, dicyclohexylphenylsulfonium trifluoromethanesulfonate, and dicyclohexylphenylsulfonium p-toluenesulfonate;

diazomethane derivatives such as bis(benzenesulfonyl)-diazomethane, bis(p-toluenesulfonyl)diazomethane, bis(xylenesulfonyl)diazomethane, bis(cyclohexylsulfonyl)-diazomethane, bis(cyclopentylsulfonyl)diazomethane, bis(n-butylsulfonyl) diazomethane, bis(isobutylsulfonyl)-diazomethane, bis(sec-butylsulfonyl)diazomethane, bis(n-propylsulfonyl) diazomethane, bis(isopropylsulfonyl)- diazomethane, diazomethane, bis(tert-butylsulfonyl) diazomethane, bis(n-amylsulfonyl) diazomethane, bis(isoamylsulfonyl)diazomethane, bis(sec-amylsulfonyl) diazomethane, bis(tert-amylsulfonyl)-diazomethane, 1-cyclohexylsulfonyl-1-(tert-butylsulfonyl)-diazomethane, diazomethane, 1-cyclohexylsulfonyl-1-(tert-amylsulfonyl)-diazomethane, and 1-tert-amylsulfonyl-1-(tert-butylsulfonyl) diazomethane;

glyoxime derivatives such as bis-o-(p-toluene-sulfonyl)-α-dimethylglyoxime, bis-o-(p-toluenesulfonyl)-α-diphenylglyoxime, bis-o-(p-toluenesulfonyl)-α-dicyclohexyl-glyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-25 butanesulfonyl)-2,3-pentanedioneglyoxime, bis-o-(n-butanesulfonyl)-2-methyl-3,4-pentanedioneglyoxime, bis-o-(methanesulfonyl)-α-dimethylglyoxime, bis-o-(trlifluoro-methanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctane-sulfonyl)-αdimethylglyoxime, bis-o-(cyclohexanesulfonyl)-α-dimethylglyoxime, bis-o-(benzenesulfonyl)-α-dimethyl-glyoxime, bis-o-(p-fluorobenzenesulfonyl)-α-dimethyl-glyoxime, bis-o-(p-tert-butylbenzenesulfonyl)-α-dimethyl-glyoxime, bis-o-(xylenesulfonyl)-α-dimethylglyoxime, and bis-o-(camphorsulfonyl)-α-dimethylglyoxime;

β-ketosulfone derivatives such as 2-cyclohexyl-carbonyl-2-(p-toluenesulfonyl)propane and 2-isopropyl-carbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris (methanesulfonyloxy) benzene, 1,2,3-tris(trifluoro-methanesulfonyloxy)benzene, and 1,2,3-tris(p-toluene-sulfonyloxy)benzene; and imidoyl sulfonate derivatives such as phthalimidoyl triflate, phthalimldoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butylsulfonate.

Preferred among these photoacid generators are onium salts such as triphenylsulfonium trifluoromethanesulfonate, (p-tert-butoxyphenyl)diphenylsulfonium trifluoromethane-sulfonate, tris(p-tert-butoxyphenyl)sulfonium trifluoro-methanesulfonate, triphenylsulfonium p-toluenesulfonate, (p-tert-butoxyphenyl) diphenylsulfonium p-toluenesulfonate, and tris(p-tert-butoxyphenyl)sulfonium p-toluenesulfonate; diazomethane derivatives such as bis (benzenesulfonyl)-diazomethane, bis(p-toluenesulfonyl) diazomethane, bis(cyclohexylsulfonyl)diazomethane, bis(n-butylsulfonyl)-diazomethane, bis(isobutylsulfonyl) diazomethane, bis(sec-butylsulfonyl) diazomethane, bis(n-propylsulfonyl)diazomethane, bis(isopropylsulfonyl) diazomethane, and bis(tert-butylsulfonyl) diazomethane; and glyoxime derivatives such as bis-o-(p-toluenesulfonyl)-α-dimethylglyoxime and bis-o-(n-butanesulfonyl)-α- dim-ethylglyoxime. These photoacid generators may be used singly or in admixture of two or more. Onium salts are effective for improving rectangularity, while diazomethane derivatives and glyoxime derivatives are effective for reducing standing waves. The combination of an onium salt with a diazomethane or a glyoxime derivative allows for finer adjustment of the profile.

The photoacid generator is preferably added in an amount of 0.2 to 20 parts, and especially 0.5 to 15 parts by weight, per 100 parts by weight of the entire base resin. Smaller amount of the photoacid generator would generate a less amount of acid upon exposure, leading to low sensitivity and resolution. Larger amount of the photoacid generator would lower the transmittance of resist to detract from resolution.

To the resist composition, a dissolution inhibitor (D) may be added. The preferred dissolution inhibitor is a compound having a weight average molecular weight of 100 to 1,000 and having on the molecule at least two phenolic hydroxyl groups, in which an average of from 10 to 100 mol% of all the hydrogen atoms on the phenolic hydroxyl groups have been replaced with acid labile groups. The compound has a weight average molecular weight of 100 to 1,000, and preferably 150 to 800. The dissolution inhibitors may be used alone or in admixture of two or more. The amount of the dissolution inhibitor added is preferably 0 to about 50 parts, more preferably about 5 to 50 parts, and most preferably about 10 to 30 parts by weight per 100 parts by weight of the base resin. Less amounts of the dissolution inhibitor may fail to yield an improved resolution, whereas excessive amounts would lead to thinning of the patterned film, and thus a decline in resolution.

In the resist composition, a basic compound (E) may be blended. The basic compound used as component (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile. Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, and amide derivatives.

Examples of suitable primary aliphatic amines include ammonia, methylamine, ethylamine, n-propylamine, isopropyl-amine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylene-diamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'- tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethyl- ethanolamine, triisopropanolamine, 2,2'-iminodiethanol, 2-aminoethanol, 3-amino-1-propanol, 4-amino-1-butanol, 4-(2-hydroxyethyl) morpholine, 2-(2-hydroxyethyl)pyridine, 1-(2-hydroxyethyl) piperazine, 1-[2-(2-hydroxyethoxy)ethyl]-peperazine, piperidine ethanol, 1-(2-hydroxyethyl)-pyrrolidine, 1-(2-hydroxyethyl)-2-pyrrolidinone, 3-piperidino-1,2-propanediol, 1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl) phthalimide, and N-(2-hydroxyethyl)-isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

Compounds in which some or all of hydroxyl groups of the hydroxyl group-bearing nitrogenous compounds are replaced by methyl group, ethyl group, methoxymethyl group, methoxyethoxymethyl group, acetyl group or ethoxyethyl group may also be used. Preferred are methyl substituents, acetyl substituents, methoxymethyl substituents and methoxyethoxy-methyl substituents of ethanolamine, diethanolamine, and triethanolamine. Examples include tris(2-methoxyethyl)amine, tris(2-ethoxyethyl)amine, tris(2-acetoxyethyl)amine, tris{2-(methoxyethoxy)ethyl}amine, tris{2-(methoxyethoxy)-ethyl}amine, tris[2-{(2-methoxyethoxy)methoxy}ethyl] amine, tris{2-(2-methoxyethoxy)ethyl}amine, tris{2-(1-methoxyethoxy)ethyl}amine, tris{2-(1-ethoxyethoxy) ethyl}-amine, tris{2-(1-ethoxypropoxy)ethyl}amine, tris[2-{(2-hydroxyethoxy)ethoxy}ethyl]amine.

The basic compounds may be used singly or in combination of two or more. The basic compound is preferably formulated in an amount of 0 to 2 parts by weight, and especially 0.01 to 1 part by weight per 100 parts by weight of the solid matter in the resist composition. The larger amount of the basic compound would result in too low a sensitivity.

The resist composition of the invention may include, as optional ingredients, a surfactant for improving the coating characteristics and a light absorbing compound for minimizing the influence of diffuse reflection from the substrate. Optional ingredients may be added in conventional amounts so long as this does not compromise the objects of the invention. Exemplary surfactants include perfluoroalkyl polyoxyethylene ethanols, fluorinated alkyl esters, perfluoroalkylamine oxides, and perfluoroalkyl EO adducts. Exemplary light absorbing compounds are diarylsulfoxides, diarylsulfones, 9,10-dimethylanthracene, and 9-fluorenone.

Pattern formation using the positive resist composition of the invention may be carried out by a known lithographic technique. For example, the resist composition may be applied onto a substrate such as a silicon wafer by spin coating to form a resist film having a thickness of 0.5 to 2.0 $\mu$m, which is then pre-baked at 80 to 120° C. The resist film is exposed to high-energy radiation such as deep-UV radiation, electron beams or x-rays, post-exposure baked (PEB) at 70 to 120° C. for 30 to 200 seconds, and developed with a base solution. Of the various types of high-energy radiation that may be used, the resist composition of the invention is best suited to fine pattern formation with deep-UV rays having a wavelength of 193 to 254 nm and electron beams.

The positive working resist composition of the invention is sensitive to high-energy radiation, has excellent sensitivity, resolution, and plasma etching resistance, and provides a resist pattern having outstanding heat resistance. Moreover, the resulting pattern is less prone to overhang formation and has an excellent dimensional controllability. The drawbacks of partial pattern collapse and footing inherent to (meth)acrylic acid copolymers are eliminated. Because these features of the inventive resist composition enable its use particularly as a resist having a low absorption at the exposure wavelength of a KrF excimer laser, a finely defined pattern having sidewalls perpendicular to the substrate can easily be formed, making the resist ideal as a micropatterning material in VLSI fabrication.

EXAMPLE

Examples of the invention are given below by way of illustration and not by way of limitation.

Synthetic Example 1

Into a 2-liter flask were admitted 93.8 g of α-methylhydroxystyrene, 54.7 g of 1-ethylcyclopentyl methacrylate, and 1.5 liters of THF as a solvent. The reactor was cooled to −70° C. in a nitrogen atmosphere, and the step of evacuation and deaeration followed by nitrogen flow was repeated three times. The reactor was warmed up to room temperature, 13.1 g of AIBN was added as a polymerization initiator, and the reactor was heated to 60° C., whereupon reaction was effected for 15 hours. The reaction solution was concentrated to a half volume and poured into 10 liters of water whereupon white solids precipitated. By filtration and vacuum drying at 60° C., 120 g of a white polymer was obtained. The resulting copolymer, designated Poly-1, was analyzed by $^{13}C$-NMR, $^1H$-NMR, and GPC, with the results shown below.

Copolymer compositional ratio (molar ratio) α-methylhydroxystyrene:1-ethylcyclopentyl methacrylate=69:31

Weight average molecular weight (Mw)=12,000

Dispersity (Mw/Mn)=1.48

Synthetic Example 2

A copolymer, designated Poly-2, was prepared by the same procedure as in Synthetic Example 1 using α-methylhydroxystyrene and 1-phenyldimethyl methacrylate. The results of analysis are given below.

Copolymer compositional ratio (molar ratio) α-methylhydroxystyrene:1-phenyldimethyl methacrylate=72:28

Weight average molecular weight (Mw)=14,000

Dispersity (Mw/Mn)=1.62

Synthetic Example 3

Into a 2-liter flask were admitted 113.4 g of hydroxystyrene, 54.7 g of 1-ethylcyclopentyl methacrylate, and 1.5 liters of THF as a solvent. The reactor was cooled to −70° C. in a nitrogen atmosphere, and the step of evacuation and deaeration followed by nitrogen flow was repeated three times. The reactor was warmed up to room temperature, 13.1 g of AIBN was added as a polymerization initiator, and the reactor was heated to 60° C., whereupon reaction was effected for 15 hours. The reaction solution was concentrated to a half volume and poured into 10 liters of water whereupon white solids precipitated. By filtration and vacuum drying at 60° C., 132 g of a white polymer was obtained. The polymer was dissolved in 1.0 liter of ethanol again, to which 50 g of sodium hydroxide was added to effect deprotection reaction. While being cooled, the reaction solution was neutralized with 28wt % hydrochloric acid. The reaction solution was concentrated and then dissolved in 0.5 liter of acetone, followed by precipitation, filtration and drying as above. There was obtained 109 g of a white copolymer. The copolymer, designated Poly-3, was analyzed by $^{13}C$-NMR, $^1H$-NMR, and GPC, with the results shown below.

Copolymer compositional ratio (molar ratio) hydroxystyrene:1-ethylcyclopentyl methacrylate=72:28

Weight average molecular weight (Mw)=12,000

Dispersity (Mw/Mn)=1.49

Synthetic Example 4

A copolymer, designated Poly-4, was prepared by the same procedure as in Synthetic Example 3 using hydroxystyrene and 1-phenyldimethyl methacrylate. The results of analysis are given below.

Copolymer compositional ratio (molar ratio) hydroxystyrene:1-phenyldimethyl methacrylate=75:25

Weight average molecular weight (Mw)=13,000

Dispersity (Mw/Mn)=1.41

Synthetic Example 5

In a 2-liter flask, 50 g of the α-methylhydroxy- styrene/1-ethylcyclopentyl methacrylate copolymer (Poly-1) was dissolved in 0.5 liter of THF in a nitrogen atmosphere. Triethylamine, 2.0 g, was added, and with stirring at 0° C., 1,4-butanediol dichloroethyl ether was added dropwise. After one hour of reaction, the reaction solution was poured into 5 liters of water containing 20 ml of acetic acid for precipitation. The solids collected by filtration were dissolved in acetone again. The solids were precipitated from 5 liters of water again, filtered and vacuum dried. The polymer, designated Poly-5, was analyzed by $^1H$-NMR to find that 4.5% of hydrogen atoms of hydroxyl groups in polyhydroxystyrene was crosslinked.

Synthetic Example 6

By the same procedure as in Synthetic Example 5, crosslinking reaction was carried out on the copolymers, Poly-2, Poly-3 and Poly-4. There were obtained crosslinked polymers, Poly-6, Poly-7 and Poly-8 having the following percent crosslink.

| Designation | Starting copolymer | % crosslink |
|---|---|---|
| Poly-6 | Poly-2 | 4.1% |
| Poly-7 | Poly-3 | 6.6% |
| Poly-8 | Poly-4 | 5.2% |

Examples and Comparative Examples

Resist compositions were formulated by dissolving 80 parts by weight of each of the crosslinked polymers obtained in the foregoing Synthesis Examples, Poly-5 to Poly-8 as the base resin, 3 parts by weight of triphenylsulfonium p-toluenesulfonate as the photoacid generator, 0.1 part by weight of triethanol amine as the basic compound, and 0.2 part by weight of 2,2-bis(4-t-butylcarboxyphenyl)propane as the dissolution inhibitor in 530 parts by weight of a 7/3 mixture of propylene glycol monoethyl acetate and ethyl lactate. These compositions were each passed through a 0.2-micron Teflon filter to give the finished resist solution.

For comparison purposes, resist solutions were similarly prepared using each of the polymers, Poly-1 to Poly-4 as the base resin.

Each resist solution was spin coated onto a silicon wafer, following which the coated silicon wafer was baked on a hot plate at 100° C. for 120 seconds. The resist film had a thickness of 0.8 μm. The resist film was exposed using an excimer laser stepper (NSR-2005EX8A, from Nikon Corporation; NA=0.5), then baked at 90° C. for 60 seconds and developed with a 2.38% solution of tetramethylammonium hydroxide in water, thereby giving a positive pattern. The resist patterns obtained were evaluated as described below.

First, the sensitivity (Eth) was determined. Next, the optimal exposure dose (sensitivity: Eop) was defined as the dose which provides a 1:1 resolution at the top and bottom of a 0.35 μm line-and-space pattern. The resolution of the resist under evaluation was defined as the minimum line width of the lines and spaces that separated at this dose. The shape of the resolved resist pattern was examined under a scanning electron microscope. Also, a 0.22 μm line-and-space pattern was observed for irregularities (partial pattern collapse and footing) under a scanning electron microscope.

The results are shown in Table 1.

TABLE 1

| | Polymer | Resolution (μm) | Partial pattern collapse | Footing |
|---|---|---|---|---|
| E1 | Poly-5 | 0.18 | slight | Good |
| E2 | Poly-6 | 0.18 | none | Good |
| E3 | Poly-7 | 0.18 | none | Good |
| E4 | Poly-8 | 0.18 | slight | Excellent |
| CE1 | Poly-1 | 0.2 | collapsed | Poor |
| CE2 | Poly-2 | 0.2 | slight | Fair |
| CE3 | Poly-3 | 0.18 | collapsed | Poor |
| CE4 | Poly-4 | 0.18 | collapsed | Fair |

As is evident from Table 1, the chemically amplified positive resist compositions of the invention provide resist patterns having a high resolution, minimized partial pattern collapse and minimized footing.

Japanese Patent Application No. 10-307727 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A positive resist composition comprising a polymer comprising recurring units of the following general formula (1) and having a weight average molecular weight of 1,000 to 500,000,

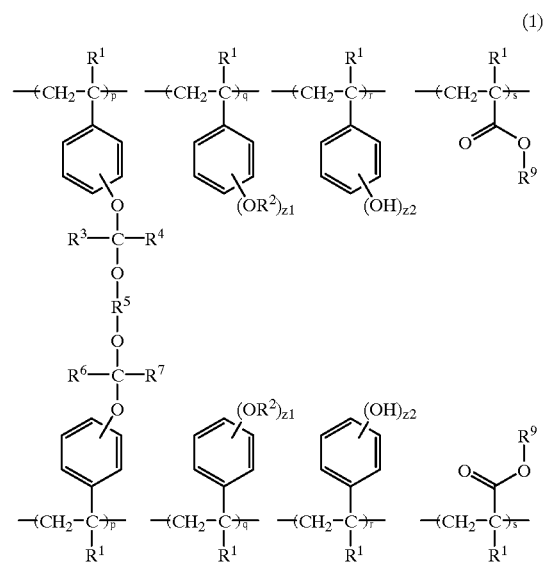

wherein $R^1$ is hydrogen or methyl, $R^2$ is an acid labile group, $R^3$, $R^4$, $R^6$, and $R^7$ are independently hydrogen or straight or branched alkyl groups of 1 to 6 carbon atoms, $R^5$ is a straight, branched or cyclic alkylene, alkylene ether, cyclohexylene or arylene group of 1 to 10 carbon atoms, $R^8$ is hydrogen, methyl, phenyl or cyano group, $R^9$ is hydrogen or a substituted or unsubstituted, straight, branched or cyclic alkyl group of 1 to 10 carbon atoms wherein the substituent is vinyl, acetyl, phenyl or cyano, p, r and s are positive numbers and q is 0 or a positive number, satisfying $0 < p/(p+q+r+s) \leq 0.8$, $0 \leq q/(p+q+r+s) \leq 0.8$, and $0 < s/(p+q+r+s) \leq 0.9$, z1 is an integer of 1 to 3, z2 is an integer of 0 to 3, and the units may be of one or more types.

2. The positive resist composition of claim 1 wherein $R^9$ is a tertiary alkyl group of the following general formula (3):

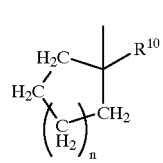

wherein $R^{10}$ is a methyl, ethyl, isopropyl, vinyl, acetyl, phenyl or cyano group, and n is an integer of 0 to 3.

3. The positive resist composition of claim 1 wherein $R^9$ is a tertiary alkyl group of the following general formula (4):

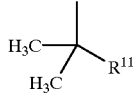
(4)

wherein $R^{11}$ is a vinyl, acetyl, phenyl or cyano group.

4. A chemical amplification type positive resist composition comprising:

(A) an organic solvent, (B) a base resin in the form of a polymer according to claim 1, and (C) a photoacid generator.

5. The resist composition of claim further comprising:

(E) a basic compound.

6. A chemical amplification type positive resist composition comprising:

(A) an organic solvent, (B) a base resin in the form of a polymer according to claim 1, (C) a photoacid generator, and (D) a dissolution inhibitor.

7. The resist composition of claim 6 further comprising (E) a basic compound.

8. A positive resist composition comprising a polymer comprising recurring units of the following general formula (2) and having a weight average molecular weight of 1,000 to 500,000,

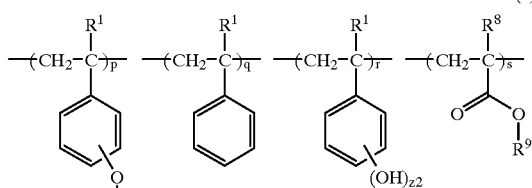
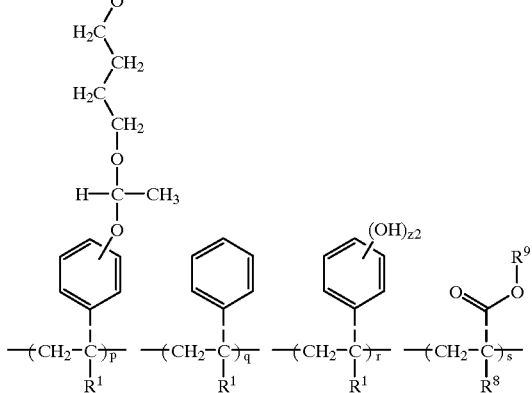
(2)

wherein $R^1$ is hydrogen or methyl, $R^8$ is hydrogen, methyl, phenyl or cyano group, $R^9$ is hydrogen or a substituted or unsubstituted, straight, branched or cyclic alkyl group of 1 to 10 carbon atoms wherein the substituent is vinyl, acetyl, phenyl or cyano, p, r and s are positive numbers and q is 0 or a positive number, satisfying $0<p/(p+q+r+s)\leq 0.8, 0\leq q/(p+q+r+s)\leq 0.8$, and $0<s/(p+q+r+s)\leq 0.9$, z2 is an integer of 0 to 3, and the units may be of one or more types.

* * * * *